(12) United States Patent
Bradley et al.

(10) Patent No.: US 6,964,539 B2
(45) Date of Patent: Nov. 15, 2005

(54) METHOD FOR MANAGING POWER CONSUMPTION OF MULTIPLE COMPUTER SERVERS

(75) Inventors: David John Bradley, Chapel Hill, NC (US); Richard Edwin Harper, Chapel Hill, NC (US); Steven Wade Hunter, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 657 days.

(21) Appl. No.: 10/100,103

(22) Filed: Mar. 18, 2002

(65) Prior Publication Data

US 2003/0177406 A1 Sep. 18, 2003

(51) Int. Cl.[7] .................................................. G06F 1/30
(52) U.S. Cl. .............................................................. 403/300
(58) Field of Search .......................................... 713/300

(56) References Cited

U.S. PATENT DOCUMENTS

| | | |
|---|---|---|
| 6,128,279 A | 10/2000 | O'Neil et al. |
| 6,128,657 A | 10/2000 | Okanoya et al. |
| 6,167,427 A | 12/2000 | Rabinovich et al. |
| 6,751,562 B1 * | 6/2004 | Blackett et al. ............... 702/61 |
| 2002/0004915 A1 * | 1/2002 | Fung .......................... 713/320 |
| 2002/0007463 A1 * | 1/2002 | Fung .......................... 713/320 |

OTHER PUBLICATIONS

Chase, J., et al.; "Managing Energy and Server Resources in Hosting Centers"; Proceedings of the ACM Symposium on Operating Systems Principles, XX, XX, vol. 35, No. 5, Oct. 21, 2001, pp. 103–116, XP002261815.

Chase, J. et al.; "Balance of Power: Energy Management for Server Clusters"; Workshop Onhot Topics in Operating Systems, XX, XX, May 2001, pp. 1–6, XP002261814.

Pinheiro E., et al.; "Load Balancing and Unbalancing for Power and Performance in Cluster-Based Systems"; Rutgers University, May 2001, pp. 4-1-4-8.

* cited by examiner

Primary Examiner—John R. Cottingham
(74) Attorney, Agent, or Firm—Martin J. McKinley; Dillon & Yudell LLP

(57) ABSTRACT

A method for managing power consumption of multiple computer servers is disclosed. The number of computer servers required to meet a current workload demand is initially determined. Next, a thermally optimized configuration of powered-on computer servers to meet the current workload demand is determined. At least one computer server is powered on or powered off, based on the thermally optimized configuration.

5 Claims, 5 Drawing Sheets

US 6,964,539 B2

METHOD FOR MANAGING POWER CONSUMPTION OF MULTIPLE COMPUTER SERVERS

RELATED PATENT APPLICATION

The present patent application is related to copending application U.S. Ser. No. 10/100,341, filed on even date, the pertinent portion of which is incorporated herein by reference.

BACKGROUND OF THE INVENTION

1. Technical Field

The present invention relates to power management in general, and in particular to power management for computer systems. Still more particularly, the present invention relates to a method for managing power consumption for multiple computer servers.

2. Description of the Related Art

Concerns over excess power consumption are no longer confined to specialized computer systems, such as computer systems specifically designed to be used in aerospace environment, but also expand to general-purpose computer systems as well. The ability of computer servers to support the high demands of present-day workloads, especially in the realm of electronic commerce and web-hosting industry, is limited by the inability of the computer servers in facilitating power consumption and heat dissipation problems. The heat dissipation problem is attributed to the large number of computer servers enclosed in a relatively small space, and the power consumption problem is attributed to the high number of high-performance processors within those computer servers. For example, a modern-day computer server complex designed for electronic commerce and web-hosting applications typically constitutes thousands of computer servers operated in parallel, occupying thousands of square footage of computer room space, with each computer server consuming many watts of power.

In certain applications, low-power processors may be a simple solution to the above-mentioned problems. However, it is safe to say that a new market-acceptable price-power-performance equilibrium has yet to be demonstrated in the computer server market, and, in fact, the performance limitations of low-power processors may limit their ultimate penetration into such market. In addition, processor power consumption, while significant, does not account for all the power consumed by a computer server. Memory controllers, adapters, disk drives, and other peripheral devices account for a large fraction of the power consumption of a computer server, and cannot be neglected.

Consequently, it would be desirable to provide an improved method for managing power consumption for computer servers.

SUMMARY OF THE INVENTION

In accordance with a preferred embodiment of the present invention, the number of computer servers required to meet a current workload demand is determined. Next, a thermally optimized configuration of powered-on computer servers to meet the current workload demand is determined. At least one computer server is powered on or powered off, based on the thermally optimized configuration.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
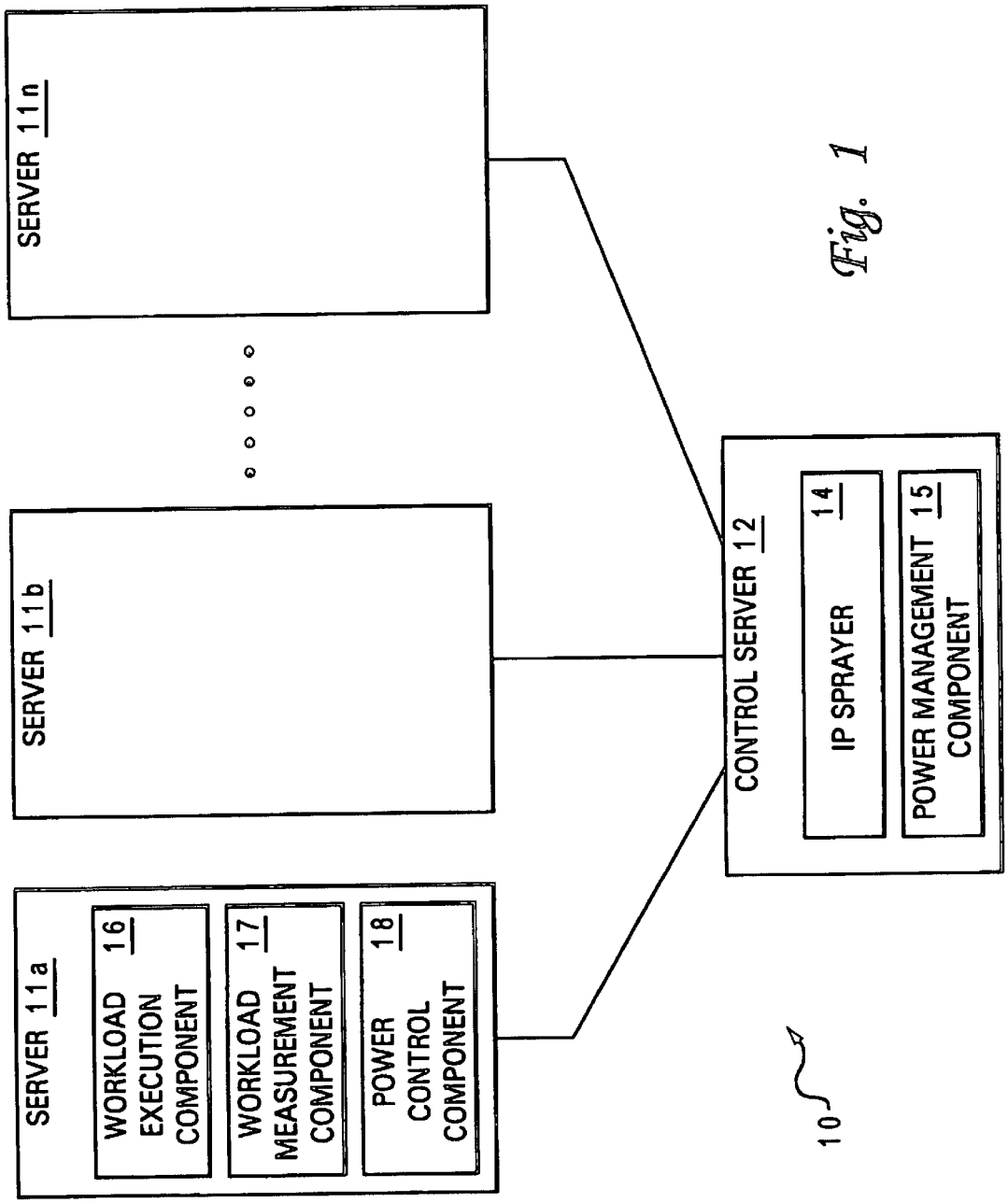
FIG. 1 is a block diagram of a computer server pool in which a preferred embodiment of the present invention is implemented.

Referring now to the drawings and in particular to FIG. 1, there is depicted a block diagram of a computer server pool in which a preferred embodiment of the present invention is implemented. As shown, a computer server pool 10 includes a group of computer servers 11a–11n connected to a control server 12. Each of computer servers 11a–11n includes a workload execution component, a workload management component, and a power control component. For example, computer server 11a includes a workload execution component 16, a workload measurement component 17, and a power control component 18. Control server 12 includes a load-balancing internet protocol (IP) sprayer 14 and a power management component 15. IP sprayer 14 provides a single IP address to the "outside world," and dispatches requests from the "outside world" (i.e., external to computer server pool 10) to any one of computer servers 11a–11n in order to balance the load amongst computer servers 11a–11n.

It is observed that electronic commerce and web-surfing workloads on a computer server pool, such as computer server pool 10 from FIG. 1, have certain characteristics that make them highly amenable to power management techniques. First, electronic commerce and web-surfing workloads exhibit periodic behavior, with the peak workload being substantially higher than the minimum workload, or even the average workload. For example, the dynamic range of the electronic commerce and web-surfing workloads are often in a factor of ten; that is, the peak workload can be ten times the minimum workload. Second, because of the stampede mentality of users of electronic commerce and web-surfing applications, the transition from a minimum workload to a maximum workload (and vice versa) can be extremely abrupt. Third, the electronic commerce and web-surfing workloads are highly parallel, and relatively easy to load balance. Fourth, server requests are short-lived enough that if a given computer server is "condemned" (i.e., new workload is withheld from it), its utilization will quickly fall, and if a new computer server is brought online, new workload can be readily dispatched to it and its utilization will quickly rise.

The above-mentioned workload attributes imply that each computer server can be powered on and powered off (including power saving mode such as hibernation mode or sleep mode) with minimal disruption to the overall operation of the computer server pool. Thus, the present invention provides a method to manage power consumption of computer servers based on measured workload, such that both unmet demand and power consumption can be minimized. In accordance with a preferred embodiment of the present invention, (1) the workload on all computer servers within a defined group is measured;
(2) a specific computer server within the defined group that needs to be powered on or powered off in the near future is determined;
(3) existing system and workload management functions are manipulated in order to remove load from a computer server to be turned off; and
(4) the specific computer server is turned on or turned off by using existing system management interfaces.

The workload of a computer server can be measured based on the following utilization metrics:
i. processor utilization;
ii. physical memory utilization;
iii. local-area network adapter bandwidth utilization; and
iv. hard disk bandwidth utilization.

The above-mentioned utilization metrics can be readily measured from an operating system. For example, for the Microsoft® Windows® operating system, utilization metrics can be derived from built-in performance counters. For the Linux operating system, utilization metrics can be derived from data residing in the /proc directory structure.

Once the workload has been measured, a power management method is used to determine which computer server needs to be turned on or turned off, and when. As a preferred embodiment of the present invention, three algorithms are devised to achieve the above-mentioned power management method, namely, a gain-based algorithm, an algorithm based on temporal characterization of previously observed workload, and a self-tuning gain-based algorithm.

I. Gain-Based Algorithm

Figure 2:
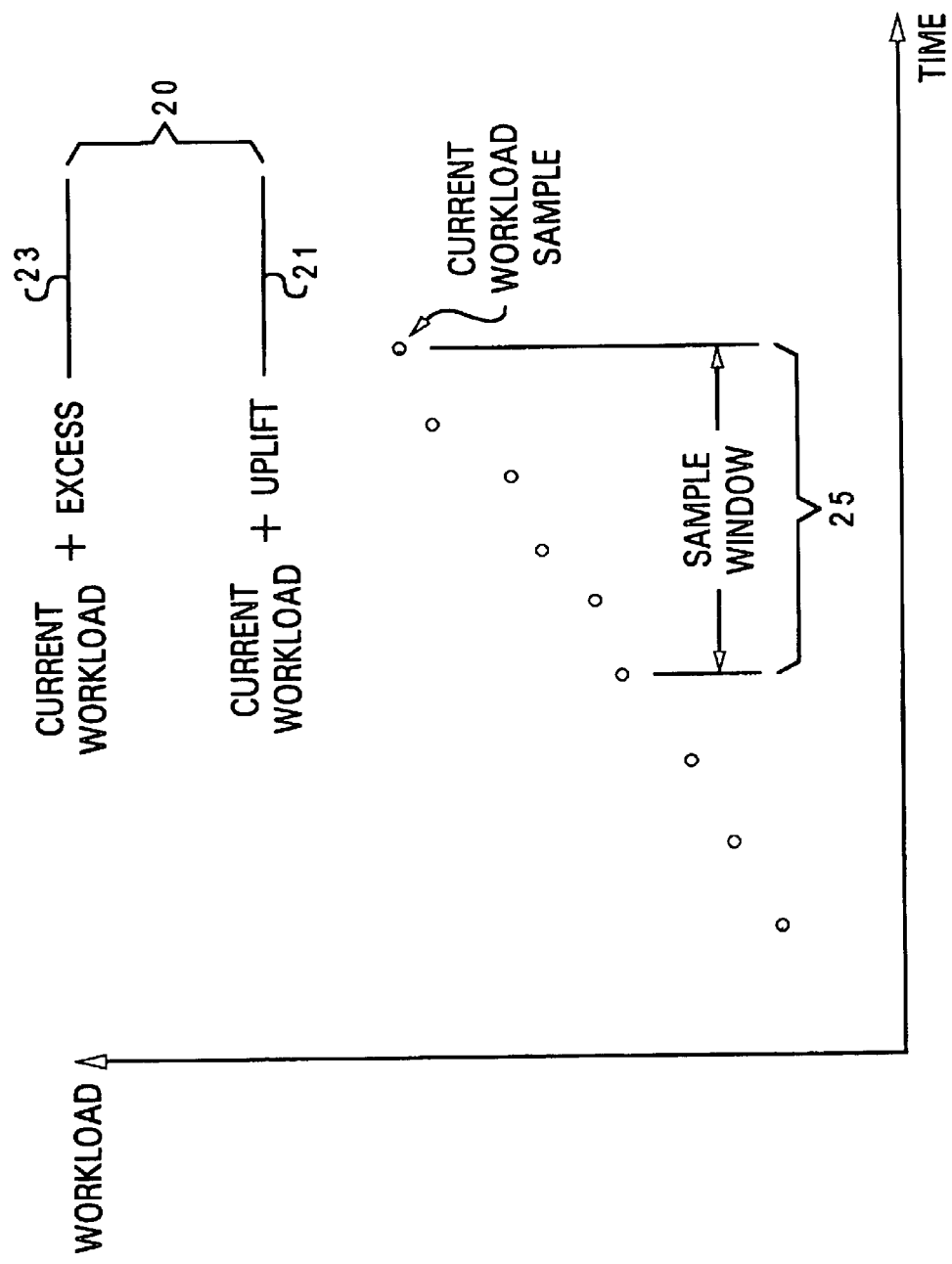
FIG. 2 is a pictorial depiction of a gain-based algorithm for managing power consumption of a computer server, in accordance with a preferred embodiment of the present invention.

With reference now to FIG. 2, there is a pictorial depiction of a gain-based algorithm for managing power consumption of a computer server, in accordance with a preferred embodiment of the present invention. The gain-based algorithm attempts to estimate a capacity envelope 20 for the workload of a computer server pool, such as computer server pool 10 from FIG. 1, in the near future. At least one of the computer servers in the computer server pool will be powered on or powered off in order to maintain the current capacity of the computer server pool within capacity envelope 20. The projection time is equal to the time required to power up a computer server and get the computer server ready for work. A lower limit 21 of capacity envelope 20 (i.e., the minimum amount of capacity deemed necessary for a given current workload) is projected by adding the current workload to an uplift that is based on the maximum sample-to-sample deviation observed over a sample window 25 (i.e., workload history). An upper limit 23 of capacity envelope 20 (i.e., the maximum amount of capacity deemed necessary for a given current workload) is projected by adding the current workload to an excess that is based on the maximum sample-to-sample deviation observed over sample window 25. Uplift is equal to the uplift gain times the maximum sample-to-sample deviation value, and excess is equal to the excess gain times the maximum sample-to-sample deviation value. If the current capacity is between lower limit 21 and upper limit 23, then no action needs to be taken. If the current capacity is less than lower limit 21, then at least one of the computer servers in the computer server pool is scheduled to be powered on. If the current capacity is greater than upper limit 23, then at least one of the computer servers in the computer server pool is scheduled to be powered off.

For example, if current capacity is 1100 workload units, current workload is 1000 workload units, sample window is 20 samples, uplift gain is 20%, and excess gain is 100%, then the gain-based algorithm is executed as follows:

(1) Select a sample window and calculate the maximum sample-to-sample deviation value (DV) of the samples within the selected sample window. For example, if the lowest workload sample is 10, and the highest workload sample is 210, then DV is 210−10=200.
(2) Calculate the projected capacity envelope.

lower limit=current workload+uplift gain*$DV$=1000+20%*200= 1040.

upper limit=current workload+excess gain*$DV$=1000+100%*200= 1200.

(3) Adjust current capacity accordingly. Since the current capacity is 1100, which is greater than the lower limit but less than the upper limit; thus, no action needs to be taken. If the current capacity were less than 1040, then one or more computer servers would need to be powered on to maintain the current capacity within the projected capacity envelope. If the current capacity were greater than 1200, then one or more computer servers would need to be powered off to maintain the current capacity within the projected capacity envelope.

Note that if the workload is constant and upper limit 23 equals lower limit 21, then the computer servers within the computer server pool will be powered on and powered off alternatively at each sample point.

The figures of merit of the gain-based algorithm are the energy consumption normalized to the energy consumption when all computer servers are powered on, and the unmet demand relative to total integrated demand, suitably adjusted to get a number between 0 and 1. The sample window size, uplift gain, and excess gain are fundamental to the performance of the gain-based algorithm, as such, they need to be chosen judiciously by users.

II. Algorithm Based on Temporal Characterization

Gain-based algorithm generally cannot account for sudden spikes in workload because it is not presaged by variations in the sample window. Many workload spikes are repetitious based on weekly or daily activities, such as daily backups. In most situations, it would be suffice to stipulate that weekly and daily periods predominate. As for epochs that are not daily or weekly, a calculation such as an auto-correlation can be performed to determine the periodic workload, and define the epochs accordingly.

Figure 3:
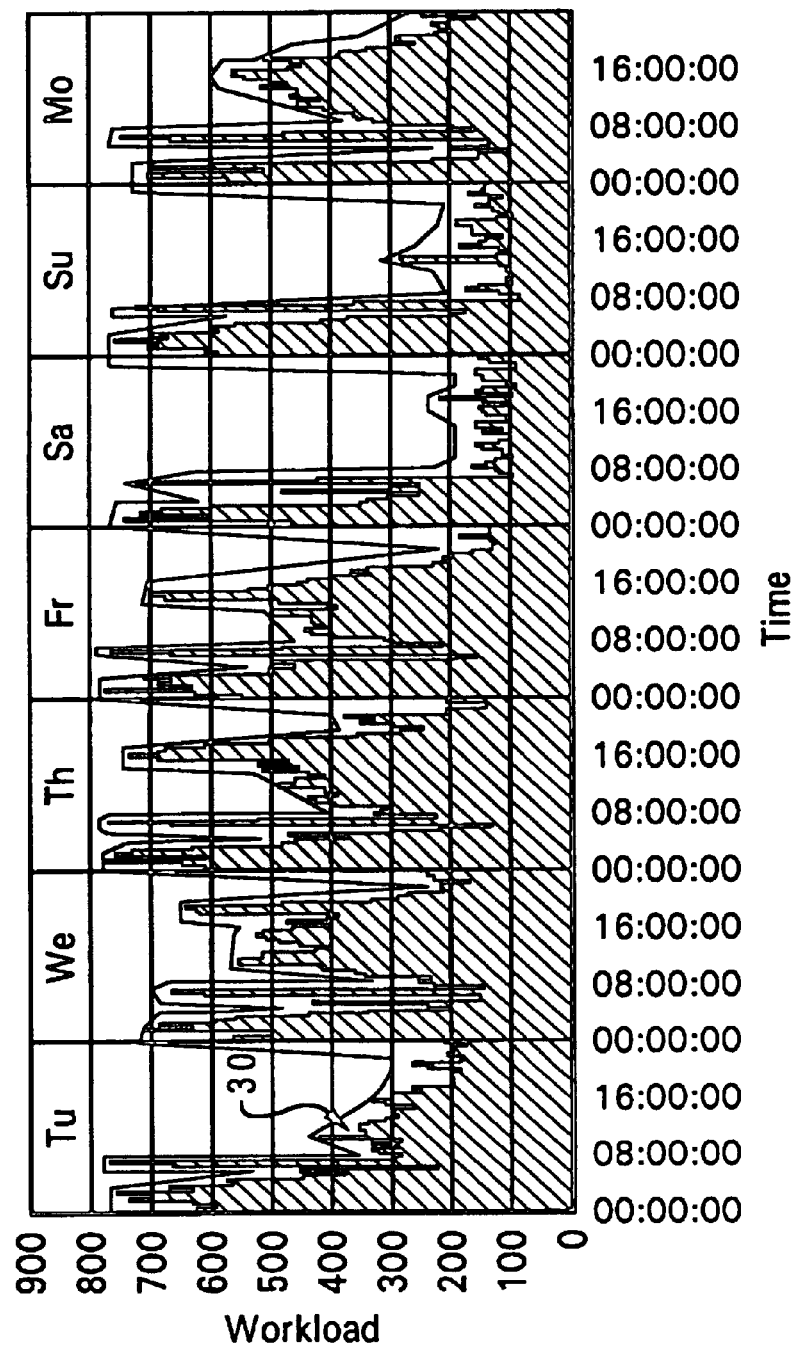
FIG. 3 is an example workload measured between Tuesday morning and Monday night.

The algorithm based on temporal characterization is based on collecting workload data over a prior epoch in time, characterizing the workload of future epochs based on the prior epoch, and setting up a power on/off schedule based on that characterization. Such approach has the benefit of speculatively powering on computer servers before sudden surges in repeatable workloads. In one possible implementation of this algorithm, a week (one epoch) can be divided into 7×24 one-hour increments, and, based on the observed workload for that week, the capacity needed for each one-hour increment is calculated, and a schedule of system capacity is pre-programmed. For example, as shown in FIG. 3, the workload of a computer server pool between Tuesday morning and Monday night is measured in order to build a power management schedule for the subsequent week. A solid line 30 located over the workload in FIG. 3 indicates the needed capacity versus time. On subsequent weeks, the algorithm based on temporal characterization can make sure that the capacity required by the characterized envelope is available prior to the need for that capacity by powering on computer servers before the sudden increases in workload. Further, as the workload changes over time, the algorithm continuously re-characterizes the workload such that the most recent workload behavior is accommodated.

The static capacity schedule from the algorithm based on temporal characterization can be overridden by exigencies of the moment when augmented with by a gain-based algorithm. For example, if in the next time increment, the schedule indicates that certain capacity is required, but a gain-based algorithm as described above indicates that more capacity is needed, then the capacity indicated by the gain-based algorithm will be used instead.

The details of one implementation of the algorithm based on temporal characterization are described below. The algorithm works in conjunction with a workload measurement component (such as workload measurement component 17 from FIG. 1) and a power control component (such as power control component 18 from FIG. 1). The workload measurement component measures the difference in utilization from one point to the next, with the intent of detecting and recording for future reference a workload spike that may not have been accommodated by the short-term algorithm (i.e., the gain-based algorithm). The measurement is performed by detecting whether the difference in utilization is greater than a predetermined value, and setting flags accordingly for future reference. For example, if the most recent sample is greater than the previous sample by a given amount (called a Threshold Up), then the workload measurement component can set a flag for that particular point in time, indicating that in one epoch minus one sample interval, the additional capacity should be added. The amount of capacity scheduled to be added in one epoch minus one sample interval depends on the difference in the most recent and the next most recent samples. If the most recent sample is less than the previous sample by a given amount (called a Threshold Down), then the workload measurement component can set a flag for that particular time indicating that in one epoch minus one sample interval from the current time, capacity should be removed. The workload measurement component performs the above-mentioned characterization for every single sample, and stores the results for future reference.

The power control component adjusts capacity for the next sample point based on utilization from prior epochs. At each sample point, the power control component examines the flags for the time point that is one epoch in the past. If the flags indicate that capacity needs to be added or removed, then the capacity adjustment component does so. There may be multiple epochs. For example, workload may exhibit a daily, weekly, and monthly repetitiveness that can be detected and exploited. Thus, the power control component must examine one day, one week, and possibly one month into the past to make the capacity adjustment decision. Because of sampling granularity, the monitoring system may mis-estimate the occurrence of a spike. Thus, when calculating the flags for a given point in time, it is useful for the algorithm to not only examine the sample immediately following the point in time, but also several samples after that point in time.

III. Self-Tuning Gain-Based Method

Uplift gain, excess gain, and sample history size comprise a three-dimensional search space that contains an optimum figure of merit that is dependent on the workload characteristics as well as the relative weighing of energy consumption and unmet demand. In general, finding the optimum values of these figures of merit within such search space is tedious and ad hoc at best, and certainly not practical or optimal for all workloads and system administration policies encountered in the field. Therefore, a self-tuning gain-based method is developed to calculate energy consumption and unmet demand based on a workload sample for a large set of values of uplift gain, excess gain, and sample history size. Then, the method searches through this set of input values to find the settings that optimize the figures of merit, for the given workload. Any search method can be used; typically, because the state space is small, an exhaustive enumeration could even be used. The self-tuning approach has the significant advantage that it can dynamically adapt not only to any workload that is encountered in the field but to changes that occur to the workload over time on any given system. The goal of the algorithm is to have the power consumption of computer servers tracking the workload of the computer servers as close as possible.

Figure 4:
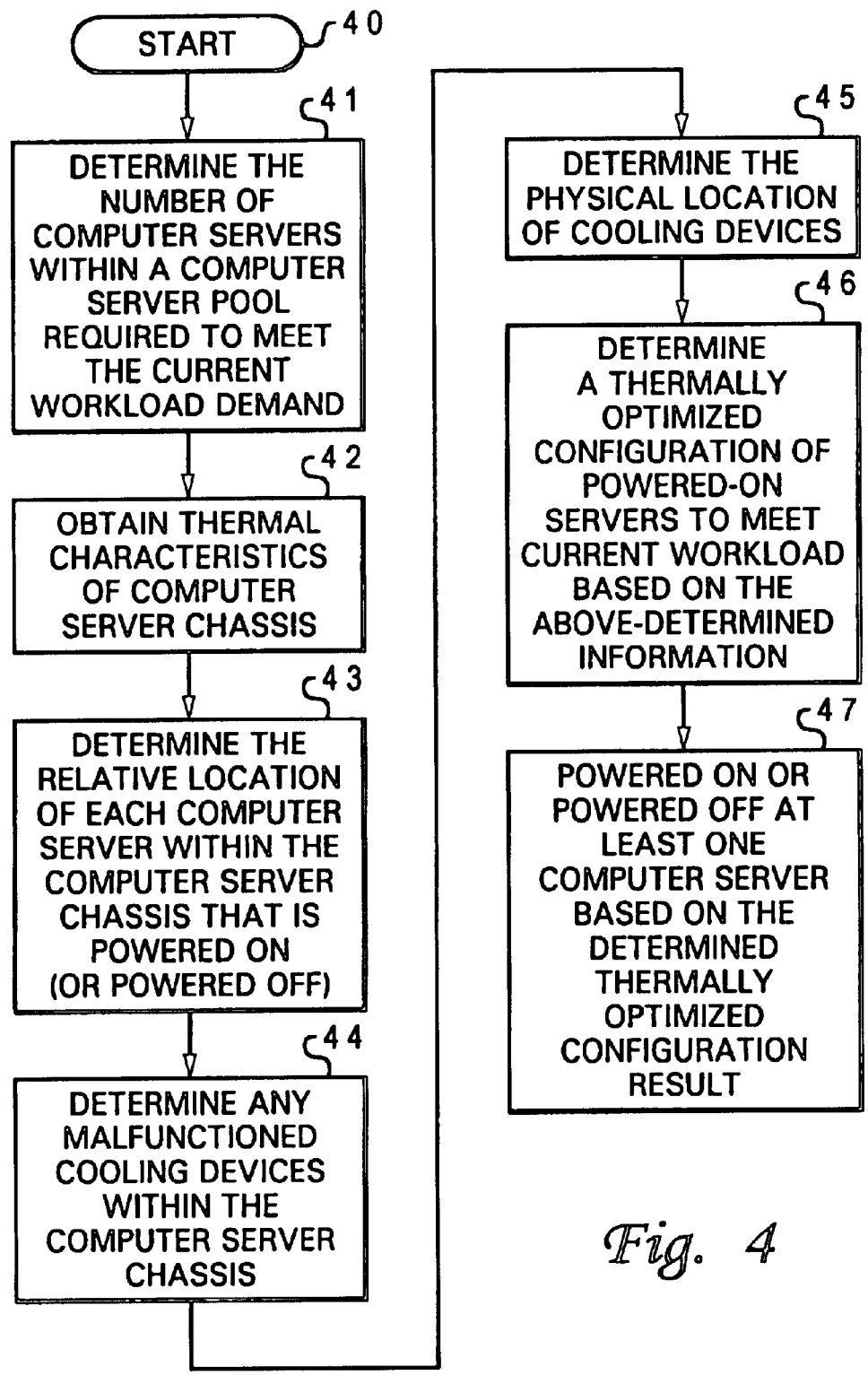
FIG. 4 is a high-level logic flow diagram of a method for determining which computer server to power on and/or off, in accordance with a preferred embodiment of the present invention.

With reference now to FIG. 4, there is illustrated a high-level logic flow diagram of a method for determining which computer server to power on or power off, in accordance with a preferred embodiment of the present invention. Starting at block 40, the number of computer servers within a computer server pool required to meet the current workload demand is first determined, as shown in block 41. Then, the thermal characteristics of the computer server chassis are obtained, as depicted in block 42. Each computer server chassis may include several computer servers, and the thermal characteristic of the computer server chassis, such as hot spots and cold spots, may be obtained by a thermal sensor included within each computer server chassis. Otherwise, each computer server within a computer server chassis may have its own thermal sensor such that the thermal characteristic of each computer server can be tracked. The relative location of each computer server within the computer server chassis that is powered on (or powered off) is determined, as shown in block 43. For example, if there are ten computer servers arranged in a linear fashion within a computer chassis, then the relative location of each computer server that is powered on, such as the third computer server from the left side of the computer server chassis, is ascertained. Next, any malfunctioned cooling devices within the computer server chassis are determined, as depicted in block 44. A physical location of cooling devices within the computer server chassis is determined, as shown in block 45. A thermally optimized configuration of powered-on servers to meet the current workload based on the above-determined information is calculated, as depicted in block 46. Finally, at least one of the computer servers is powered on or powered off based on the calculated thermally optimized configuration result, as shown in block 47.

Figure 5:
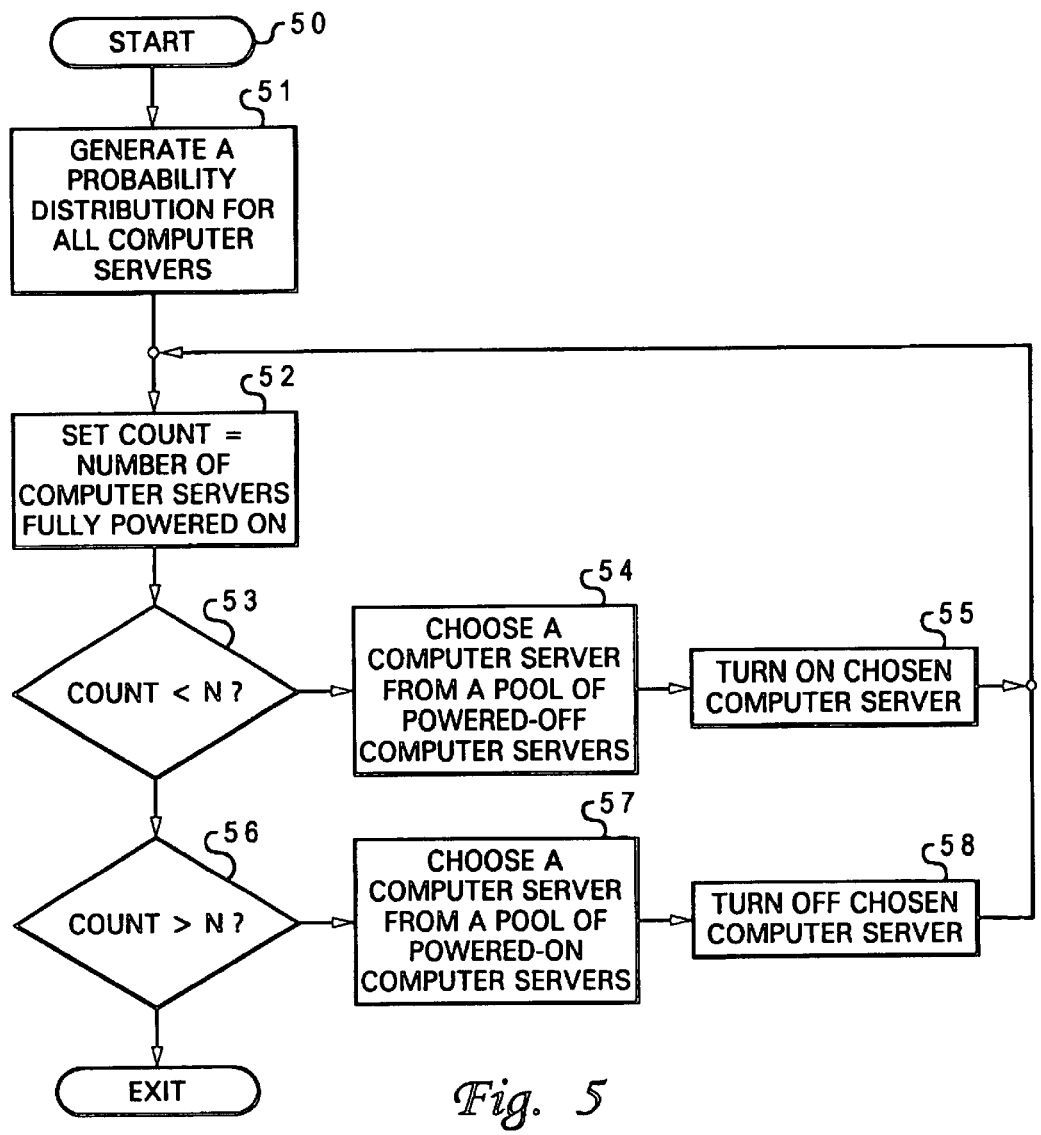
FIG. 5 is a high-level logic flow diagram of a method for determining a thermally optimized configuration of powered-on computer servers, in accordance with a preferred embodiment of the present invention.

Referring now to FIG. 5, there is illustrated a high-level logic flow diagram of a method for determining a thermally optimized configuration of powered-on computer servers, in accordance with a preferred embodiment of the present invention. Assume the total number of available computer servers within a computer server pool is M, and the number of computer servers required to meet the current workload is N. Starting at block 50, a probability distribution is generated to provide each of computer servers M a probability to be powered on, as shown in block 51. For example, each of the computer servers M can be provided with a equal probability of 1, but those computer servers that are located in the proximity of a cooling device, such as a fan, can be provided with a higher probability of 2 or 3 such that those computer servers will have a higher probability to be powered on when needed. Then, a variable count is set to the number of computer servers fully powered on, as depicted in block 52. A determination is then made as to whether or not the count is less than N, as shown in block 53. If the count is less than N, a computer server is randomly chosen from all the powered-off computer servers, using the probability distribution, as depicted in block 54. The chosen computer server is then powered on, as shown in block 55.

Otherwise, if the count is not less than N, then another determination is made as to whether or not the count is greater than N, as shown in block 56. If the count is greater than N, a computer server is randomly chosen from all the powered-on computer servers, using the probability distribution, as depicted in block 57. The chosen computer server is then powered off, as shown in block 58. The process exits when the count equals N.

As has been described, the present invention provides a method for managing power consumption for multiple computer servers.

It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for managing power consumption for multiple computer servers, said method comprising:
   determining the number of computer servers required to meet a current workload demand;
   determining a thermally optimized configuration of powered-on computer servers to meet said current workload demand by:
      determining thermal characteristics of a chassis enclosing said number of computer servers;
      determining a physical location of cooling devices within said chassis enclosing said number of computer servers;
      determining which of said number of computer servers are currently powered on; and
      determining a physical location of any malfunctioned cooling devices; and
   powering on or powering off at least one computer server from said number of computer server based on said thermally optimized configuration.

2. A computer program product residing on a computer usable medium for managing power consumption for multiple computer servers, said computer program product comprising:
   program code means for determining the number of computer servers required to meet a current workload demand;
   program code means for determining a thermally optimized configuration of powered-on computer servers to meet said current workload demand, wherein said program code means for determining a thermally optimized configuration further includes:
      program code means for determining thermal characteristics of a chassis enclosing said number of computer servers;
      program code means for determining a physical location of cooling devices within said chassis enclosing said number of computer servers; and
      program code means for determining which of said number of computer servers are currently powered on; and
   program code means for powering on or powering off at least one computer server from said number of computer servers based on said thermally optimized configuration.

3. The computer program product of claim 2, wherein said program code means for determining a thermally optimized configuration further includes program code means for determining a physical location of any malfunctioned cooling devices.

4. A computer system capable of managing power consumption for multiple computer servers, said computer system comprising:
   means for determining the number of computer servers required to meet a current workload demand;
   means for determining a thermally optimized configuration of powered-on computer servers to meet said current workload demand, wherein said means for determining a thermally optimized configuration further includes:
      means for determining thermal characteristics of a chassis enclosing said number of computer servers;
      means for determining a physical location of cooling devices within said chassis enclosing said number of computer servers; and
      means for determining which of said number of computer servers are currently powered on; and
   means for powering on or powering off at least one computer server from said number of computer servers based on said thermally optimized configuration.

5. The computer system of claim 4, wherein said computer system means for determining a thermally optimized configuration further includes computer system means for determining a physical location of any malfunctioned cooling devices.

* * * * *